(12) United States Patent
Jeong et al.

(10) Patent No.: US 7,679,124 B2
(45) Date of Patent: Mar. 16, 2010

(54) ANALOG CAPACITOR AND METHOD OF MANUFACTURING THE SAME

(75) Inventors: Yong-kuk Jeong, Seoul (KR); Seok-jun Won, Seoul (KR); Dae-jin Kwon, Suwon-si (KR); Min-woo Song, Seongnam-si (KR); Weon-hong Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 129 days.

(21) Appl. No.: 11/187,489

(22) Filed: Jul. 22, 2005

(65) Prior Publication Data
US 2006/0022245 A1 Feb. 2, 2006

(30) Foreign Application Priority Data

Jul. 28, 2004 (KR) .................. 10-2004-0059357
Feb. 3, 2005 (KR) .................. 10-2005-0010090

(51) Int. Cl.
*H01L 27/108* (2006.01)
(52) U.S. Cl. ................ 257/310; 257/E21.647
(58) Field of Classification Search ........... 257/310, 257/E21.647
See application file for complete search history.

(56) References Cited
U.S. PATENT DOCUMENTS 6,341,056 B1 * 1/2002 Allman et al. ............ 361/312

2004/0002188 A1 * 1/2004 Chung .................... 438/240

(Continued)

FOREIGN PATENT DOCUMENTS

| JP | 2001-217408 | 8/2001 |
|---|---|---|
| KR | 10-2002-0002596 | 1/2002 |
| KR | 10-0343452 | 6/2002 |
| KR | 10-2003-0056227 | 7/2003 |
| KR | 10-2004-0059878 | 7/2004 |

(Continued)

OTHER PUBLICATIONS

Kang, Chang Seok et al., "The Electrical and Material Characterization of Hafnium Oxynitride Gate Dielectrics With TaN-Gate Electrode", Feb. 2004, IEEE Transactions on Electron Devices, vol. 52.*

(Continued)

*Primary Examiner*—Bradley K Smith
*Assistant Examiner*—Amar Movva
(74) *Attorney, Agent, or Firm*—Mills & Onello, LLP

(57) ABSTRACT

An analog capacitor capable of reducing the influence of an applied voltage on a capacitance and a method of manufacturing the analog capacitor are provided. The analog capacitor includes a lower electrode which is formed on a substrate, a multi-layered dielectric layer which includes at least one oxide layer and at least one oxynitride layer which are formed of a material selected from the group consisting of Hf, Al, Zr, La, Ba, Sr, Ti, Pb, Bi and a combination thereof and is formed on the lower electrode, and an upper electrode which is formed on the multi-layered dielectric layer.

4 Claims, 4 Drawing Sheets

U.S. PATENT DOCUMENTS

| | | | |
|---|---|---|---|
| 2004/0043569 A1 | 3/2004 | Ahn et al. | 438/287 |
| 2004/0046197 A1* | 3/2004 | Basceri et al. | 257/296 |
| 2004/0141390 A1* | 7/2004 | Won et al. | 365/200 |
| 2004/0185613 A1* | 9/2004 | Lin et al. | 438/245 |
| 2004/0198069 A1* | 10/2004 | Metzner et al. | 438/785 |
| 2005/0087790 A1* | 4/2005 | Dornisch et al. | 257/310 |

FOREIGN PATENT DOCUMENTS

| | | | | |
|---|---|---|---|---|
| KR | 10-2004-0060443 | * | 7/2004 | 365/200 |
| KR | 10-2005-0057952 | | 6/2005 | |

OTHER PUBLICATIONS

Dielectric Constant Behavior of Hf—O—N System Tsunehiro INO, Yuuichi Kamimuta, Masamichi Suzuki, Masato Koyama and Akira Nishiyama Advanced LSI Technology Laboratory, Corporate Research and Development Center, Toshiba Corporation, 1 Komukai-Toshiba-cho, Saiwai-ku, Kawasaki 212-8582, Japan.*

* cited by examiner

ANALOG CAPACITOR AND METHOD OF MANUFACTURING THE SAME

This application claims priority from Korean Patent Application Nos. 10-2004-0059357 and 10-2005-0010090 filed on Jul. 28, 2004 and Feb. 3, 2005, respectively, in the Korean Intellectual Property Office, the contents of which are incorporated herein in their entirety by reference.

BACKGROUND OF THE INVENTION

1. Field of the Invention

The present invention relates to a semiconductor device and a method of manufacturing the same, and more particularly, to an analog capacitor and a method of manufacturing the same.

2. Description of the Related Art

Merged memory logics (MML) are emerging devices in which a memory cell array part, for example, a dynamic random access memory (DRAM), and an analog circuit or a peripheral circuit are integrated together within one chip. Introduction of the MML has resulted in great improvements to multimedia functions and has allowed highly integrated high-speed semiconductor devices.

In analog circuits requiring high-speed operation, a semiconductor device having a large capacity capacitor is under development.

Generally, in a case where a capacitor has a polysilicon-insulator-polysilicon (PIP) structure, since an upper electrode and a lower electrode are formed of conductive polysilicon, oxidation occurs at an interface between the upper electrode and a dielectric thin film or an interface between the lower electrode and the dielectric thin film so that a native oxide layer is formed. This results in a decrease in the total capacitance of the capacitor. Further, the capacitance of the capacitor is decreased due to a depletion region formed in a polysilicon layer. Thus, the PIP structure is not desirable for semiconductor devices requiring high-speed and high-frequency operations.

In order to solve this problem, the structure of the capacitor has been changed into a metal/insulator/silicon (MIS) structure or a metal/insulator/metal (MIM) structure. Having low specific resistance and no parasitic capacitance due to depletion, an MIM-type capacitor is usually used for a high-performance semiconductor device.

An analog capacitor having an MIM structure according to the prior art includes a lower electrode and an upper electrode which are formed of TiN and a dielectric layer which is located between the lower electrode and the upper electrode and is formed of $HfO_2$ having a high dielectric constant.

Generally, as the size of semiconductor devices becomes smaller, the thickness of the dielectric layer of the capacitor must be reduced to ensure sufficient capacitance of the capacitor. However, when the thickness of the dielectric layer is reduced, as a voltage applied to the dielectric layer through the lower electrode and the upper electrode changes, the capacitance of the dielectric layer changes. The greater the change in capacitance of the dielectric layer according to the applied voltage, the worse the precision of an analog circuit. Thus, in order to maintain uniform capacitance and a leakage current characteristic, it is necessary to develop a thin-film capacitor and a material suitable for forming the thin-film capacitor.

Further, in order to prevent damage to the analog capacitor due to a high applied voltage, it is necessary to develop a material having a high breakdown voltage while suppressing a leakage current.

SUMMARY OF THE INVENTION

The present invention provides an analog capacitor, which can maintain a uniform capacitance without being affected by an applied voltage, and has a low leakage current and a high breakdown voltage.

The present invention also provides a method of manufacturing the analog capacitor.

According to an aspect of the present invention, there is provided an analog capacitor comprising a lower electrode which is formed on a substrate, a multi-layered dielectric layer which includes at least one oxide layer and at least one oxynitride layer which are formed of a material selected from the group consisting of Hf, Al, Zr, La, Ba, Sr, Ti, Pb, Bi and a combination thereof and is formed on the lower electrode, and an upper electrode which is formed on the multi-layered dielectric layer.

In one embodiment, the oxide layer is formed of a material selected from the group consisting of $HfO_2$, $Al_2O_3$, $ZrO_2$, $La_2O_3$, BST, PZT, BTO, STO, Ti-doped TaO and a combination thereof.

In one embodiment, the oxynitride layer is formed of a material selected from the group consisting of $HfO_xN_y$, $AlO_xN_y$, $ZrO_xN_y$, $LaO_xN_y$, $BSTO_xN_y$, $PZTO_xN_y$, $BTO_xN_y$, $STO_xN_y$, Ti-doped $TaO_xN_y$ and a combination thereof.

In one embodiment, the oxynitride layer is formed at an interface between the multi-layered dielectric layer and the lower electrode. In one embodiment, the nitrogen concentration in the oxynitride layer is higher than the oxygen concentration in the oxynitride layer near the lower electrode.

In one embodiment, the lower electrode and/or the upper electrode are formed of a material selected from the group consisting of polysilicon, TiN, TaN, Ti, Ta, W, WN, Al, Cu, Ru, Pt, Ir, $RuO_2$, $IrO_2$, and a combination thereof.

According to another aspect of the present invention, there is provided an analog capacitor including a TiN lower electrode which is formed on a substrate, a multi-layered dielectric layer which is formed on the TiN lower electrode and has a stack structure selected from the group consisting of $TaO_xN_y$—$HfO_2$—$Ta_2O_5$, $Ta_2O_5$—$HfO_xN_y$—$Ta_2O_5$, $Ta_2O_5$—$HfO_2$—$TaO_xN_y$, $Ta_2O_5$—$HfO_xN_y$—$TaO_xN_y$, $TaO_xN_y$—$HfO_2$—$TaO_xN_y$, $TaO_xN_y$—$HfO_xN_y$—$Ta_2O_5$, $HfO_xN_y$—$Ta_2O_5$—$HfO_2$, $HfO_2$—$TaO_xN_y$—$HfO_2$, $HfO_2$—$Ta_2O_5$—$HfO_xN_y$, $HfO_2$—$TaO_xN_y$—$HfO_xN_y$, $HfO_xN_y$—$Ta_2O_5$—$HfO_xN_y$, and $HfO_xN_y$—$TaO_xN_y$—$HfO_2$, and a TiN upper electrode which is formed on the multi-layered dielectric layer.

In one embodiment, the $TaO_xN_y$ or $HfO_xN_y$ layer is formed at an interface between the multi-layered dielectric layer and the TiN lower electrode. In one embodiment, the nitrogen concentration in the $TaO_xN_y$ or $HfO_xN_y$ layer is higher than the oxygen concentration in the $TaO_xN_y$ or $HfO_xN_y$ layer near the TiN lower electrode.

According to still another aspect of the present invention, there is provided an analog capacitor including a lower electrode which is formed on a substrate, a multi-layered dielectric layer which includes a stack structure of oxide layer-oxynitride layer-oxide layer formed of a material selected from the group consisting of Hf, Al, Zr, La, Ba, Sr, Ti, Pb, Bi and a combination thereof and is formed on the lower electrode, and an upper electrode which is formed on the multi-layered dielectric layer.

In one embodiment, the oxide layer is formed of a material selected from the group consisting of $HfO_2$, $Al_2O_3$, $ZrO_2$, $La_2O_3$, BST, PZT, BTO, STO, Ti-doped TaO and a combination thereof.

In one embodiment, the oxynitride layer is formed of a material selected from the group consisting of $HfO_xN_y$, $AlO_xN_y$, $ZrO_xN_y$, $LaO_xN_y$, $BSTO_xN_y$, $PZTO_xN_y$, $BTO_xN_y$, $STO_xN_y$, Ti-doped $TaO_xN_y$, and a combination thereof.

In one embodiment, the multi-layered dielectric layer has a stacked structure of $HfO_2/HfO_xN_y/HfO_2$.

In one embodiment, the oxynitride layer contains carbon.

In one embodiment, the oxynitride layer is more amorphous than the oxide layer.

In one embodiment, the lower electrode and/or the upper electrode are formed of a material selected from the group consisting of polysilicon, TiN, TaN, Ti, Ta, W, WN, Al, Cu, Ru, Pt, Ir, $RuO_2$, $IrO_2$, and a combination thereof.

According to a further aspect of the present invention, there is provided a method of manufacturing an analog capacitor including forming a lower electrode on a substrate, forming a multi-layered dielectric layer, which includes at least one oxide layer and at least one oxynitride layer which are formed of a material selected from the group consisting of Hf, Al, Zr, La, Ba, Sr, Ti, Pb, Bi and a combination thereof, on the lower electrode, and forming an upper electrode on the multi-layered dielectric layer.

In one embodiment, the multi-layered dielectric layer is formed using a plasma enhanced atomic layer deposition (PEALD) process or a plasma enhanced chemical vapor deposition (PECVD) process.

In one embodiment, the oxide layer is formed using $O_2$ plasma. In one embodiment, the oxide layer is formed of a material selected from the group consisting of $HfO_2$, $Al_2O_3$, $ZrO_2$, $La_2O_3$, BST, PZT, BTO, STO, Ti-doped TaO and a combination thereof.

In one embodiment, the oxynitride layer is formed using $NH_3$ plasma and $O_2$ plasma alternately. In one embodiment, the oxynitride layer is formed of a material selected from the group consisting of $HfO_xN_y$, $AlO_xN_y$, $ZrO_xN_y$, $LaO_xN_y$, $BSTO_xN_y$, $PZTO_xN_y$, $BTO_xN_y$, $STO_xN_y$, Ti-doped $TaO_xN_y$ and a combination thereof.

In one embodiment, the forming of the multi-layered dielectric layer comprising forming the oxynitride layer at the interface between the multi-layered dielectric layer and the lower electrode. In one embodiment, the nitrogen concentration in the oxynitride layer is higher than the oxygen concentration in the oxynitride layer near the lower electrode.

In one embodiment, the lower electrode and/or the upper electrode are formed of one material selected from the group consisting of polysilicon, TiN, TaN, Ti, Ta, W, WN, Al, Cu, Ru, Pt, Ir, $RuO_2$, $IrO_2$, and a combination thereof.

According to yet another aspect of the present invention, there is provided a method of manufacturing an analog capacitor including forming a TiN lower electrode on a substrate, forming a multi-layered dielectric layer, which has a stack structure selected from the group consisting of $TaO_xN_y$—$HfO_2$—$Ta_2O_5$, $Ta_2O_5$—$HfO_xN_y$—$Ta_2O_5$, $Ta_2O_5$—$HfO_2$—$TaO_xN_y$, $Ta_2O_5$—$HfO_xN_y$—$TaO_xN_y$, $TaO_xN_y$—$HfO_2$—$TaO_xN_y$, $TaO_xN_y$—$HfO_xN_y$—$Ta_2O_5$, $HfO_xN_y$—$Ta_2O_5$—$HfO_2$, $HfO_2$—$TaO_xN_y$—$HfO_2$, $HfO_2$—$Ta_2O_5$—$HfO_xN_y$, $HfO_2$—$TaO_xN_y$—$HfO_xN_y$, $HfO_xN_y$—$Ta_2O_5$—$HfO_xN_y$, and $HfO_xN_y$—$TaO_xN_y$—$HfO_2$, on the TiN lower electrode, and forming a TiN upper electrode on the multi-layered dielectric layer.

In one embodiment, the forming of the multi-layered dielectric layer is performed using a PEALD process.

In one embodiment, the forming of the multi-layered dielectric layer comprises forming the $TaO_xN_y$ layer or the $HfO_xN_y$ layer at an interface between the multi-layered dielectric layer and the lower electrode. In one embodiment, the nitrogen concentration in the $TaO_xN_y$ or $HfO_xN_y$ layer is higher than the oxygen concentration in the $TaO_xN_y$ or $HfO_xN_y$ layer near the lower electrode.

According to a further aspect of the present invention, there is provided a method of manufacturing an analog capacitor including forming a lower electrode on a substrate, forming a multi-layered dielectric layer, which includes a stacking structure of oxide layer-oxynitride layer-oxide layer formed of a material selected from the group consisting of Hf, Al, Zr, La, Ba, Sr, Ti, Pb, Bi and a combination thereof, on the lower electrode, and forming an upper electrode on the multi-layered dielectric layer.

In one embodiment, the multi-layered dielectric layer is formed using a plasma enhanced atomic layer deposition (PEALD) process or a plasma enhanced chemical vapor deposition (PECVD) process.

In one embodiment, the oxide layer is formed using $O_2$ plasma. In one embodiment, the oxide layer is formed of a material selected from the group consisting of $HfO_2$, $Al_2O_3$, $ZrO_2$, $La_2O_3$, BST, PZT, BTO, STO, Ti-doped TaO and a combination thereof.

In one embodiment, the oxynitride layer is formed using $NH_3$ plasma and $O_2$ plasma alternately. In one embodiment, the oxynitride layer is formed of a material selected from the group consisting of $HfO_xN_y$, $AlO_xN_y$, $ZrO_xN_y$, $LaO_xN_y$, $BSTO_xN_y$, $PZTO_xN_y$, $BTO_xN_y$, $STO_xN_y$, Ti-doped $TaO_xN_y$ and a combination thereof.

In one embodiment, multi-layered dielectric layer has a stacked structure of $HfO_2/HfO_xN_y/HfO_2$. In one embodiment, $HfO_2$ is formed by PEALD using $O_2$ plasma.

In one embodiment, $HfO_xN_y$ is formed by PEALD using $NH_3$ plasma and $O_2$ plasma alternately.

In one embodiment, the lower electrode and/or the upper electrode are formed of one material selected from the group consisting of polysilicon, TiN, TaN, Ti, Ta, W, WN, Al, Cu, Ru, Pt, Ir, $RuO_2$, $IrO_2$, and a combination thereof.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 2 through 4 are graphs of measured data showing changes in capacitance of the analog capacitor according to changes in voltage applied to the analog capacitor; wherein FIG. 2 is a graph of measured data showing changes in capacitance of an analog capacitor having a structure of lower electrode-$HfO_2$-upper electrode according to changes in voltage applied to the analog capacitor; FIG. 3 is a graph of measured data showing changes in capacitance of an analog capacitor having a structure of lower electrode-$HfO_xN_y$-upper electrode according to changes in voltage applied to the analog capacitor; and FIG. 4 is a graph of measured data showing changes in capacitance of an analog capacitor having a structure of lower electrode-$HfO_xN_y$—$HfO_2$-upper electrode according to changes in voltage applied to the analog capacitor.

DETAILED DESCRIPTION OF THE INVENTION

In the present invention, an analog capacitor having a polysilicon-insulator-polysilicon (PIP) structure, a metal-insulator-silicon (MIS) structure or a metal-insulator-metal (MIM) structure, or the like is used. The present invention is described using an analog capacitor having an MIM structure for convenience of description.

Further, the analog capacitor used in the present invention can be used in an advanced analog CMOS technology, particularly, an analog-to-digital converter (ADC) or a switched capacitor filter, a mixed-signal device, an RF device, or the like. The analog capacitor can be formed in the form of heavily doped silicon-insulator-silicon (SIS) to ensure high accuracy.

Hereinafter, an analog capacitor according to one embodiment of the present invention and a method of manufacturing the same are described with reference to FIGS. 1 through 4.

Figure 1:
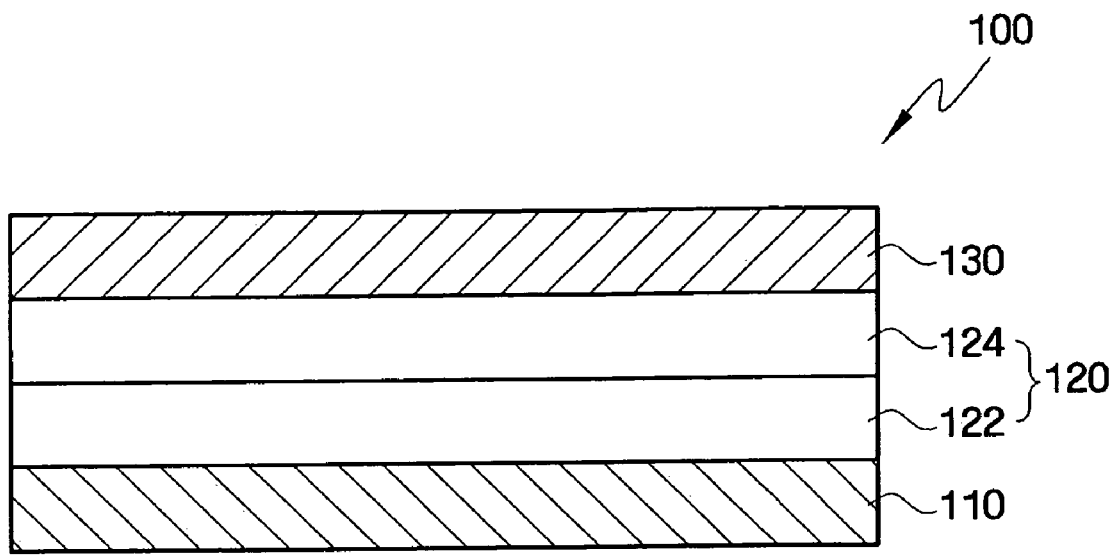
FIG. 1 is a schematic cross-sectional view showing a structure of an analog capacitor according to one embodiment of the present invention.

FIG. 1 is a cross-sectional view showing a structure of an analog capacitor according to one embodiment of the present invention. As shown in FIG. 1, an analog capacitor 100 has a structure in which a lower electrode 110, a dielectric layer 120 and an upper electrode 130 are stacked sequentially.

Here, the lower electrode 110 and the upper electrode 130 can be formed of a material selected from the group consisting of polysilicon, TiN, TaN, Ti, Ta, W, WN, Al, Cu, Ru, Pt, Ir, $RuO_2$, $IrO_2$, and a combination thereof. Moreover, in a case of the analog capacitor 100 having the MIM structure, it is preferable that TiN is used as the lower electrode 110 and the upper electrode 130 in consideration of an interference characteristic between the layers and electrical conductivity. Further, the lower electrode 110 and the upper electrode 130 can be formed in various shapes such as a cylinder shape or a stack shape.

The dielectric layer 120 includes at least one oxide layer 124 and at least one oxynitride layer 122. Here, the analog capacitor 100 according to one embodiment of the present invention shown in FIG. 1 has a structure in which the oxynitride layer 122 and the oxide layer 124 are sequentially stacked on the lower electrode 110. However, the present invention is not limited by the order in which the oxynitride layer 122 and the oxide layer 124 are stacked and the number of oxynitride layers 122 and oxide layers 124. That is, the dielectric layer 120 is composed of a combination of any number of oxynitride layers 122 and oxide layers 124 stacked in any order.

The oxynitride layer 122 can be formed of a material selected from the group consisting of Al, Ti, Sr, Zr, Ba, La, Hf, Pb, Bi and a combination thereof. For example, the oxynitride layer 122 can be formed of a material selected from the group consisting of $HfO_xN_y$, $AlO_xN_y$, $ZrO_xN_y$, $LaO_xN_y$, $BSTO_xN_y$, $PZTO_xN_y$, $BTO_xN_y$, $STO_xN_y$, Ti-doped $TaO_xN_y$, and a combination thereof.

The oxide layer 124 can be formed of a material selected from the group consisting of Al, Ti, Sr, Zr, Ba, La, Hf, Pb, Bi and a combination thereof. For example, the oxide layer 124 can be formed of a material selected from the group consisting of $HfO_2$, $Al_2O_3$, $ZrO_2$, $La_2O_3$, BST, PZT, BTO, STO, Ti-doped TaO and a combination thereof.

Hereinafter, an analog capacitor in accordance with the invention having a structure of lower electrode-$HfO_xN_y$—$HfO_2$-upper electrode will be described in detail.

Referring to FIG. 1, first, the lower electrode 110 is formed on a substrate (not shown). Here, the lower electrode 110 can be formed of TiN in consideration of an interference characteristic between the layers and electrical conductivity.

Afterward, the oxynitride layer 122 is formed on the lower electrode 110 using $NH_3$ plasma and $O_2$ plasma. $HfO_xN_y$ can be used as the oxynitride layer 122 according to one embodiment of the present invention. At this time, the oxynitride layer 122 can be formed on the lower electrode 110 using a plasma enhanced atomic layer deposition (PEALD) process or a plasma enhanced chemical vapor deposition (PECVD) process. Preferably, the oxynitride layer 122 can be formed using the PEALD process.

The PEALD process for forming the oxynitride layer 122 formed of $HfO_xN_y$ is as follows. Tetrakis (ethyl methyl amido) hafnium (TEMAH) is used as a precursor for forming $HfO_xN_y$, an inside pressure of a chamber is maintained to about 3 torr, and a substrate temperature is maintained at a temperature of about 300° C. First, an inner part of the chamber is purged using Ar gas and then a plasma process is performed while $NH_3$ gas is supplied at a fixed rate of about 100 sccm for about 1 second. Next, a plasma process is performed while $O_2$ gas is supplied at a fixed rate of about 90 sccm for about 1 second, thereby forming the oxynitride layer 122. At this time, the purge process using Ar gas can be selectively performed in the middle of the $NH_3$ plasma process and the $O_2$ plasma process. Further, the order in which the $NH_3$ plasma process and the $O_2$ plasma process are performed can be changed.

Here, various gases containing nitrogen can be used instead of $NH_3$ plasma. For example, $NH_3$ gas, $N_2$ gas, $N_2$ plasma, $N_2O$ gas, $N_2O$ plasma, or the like, can be used. Further, various gases containing oxygen can be used instead of $O_2$ plasma. For example, $O_2$ gas, $O_3$ gas, $H_2O$ gas, or the like, can be used.

Next, the oxide layer 124 is formed on an upper part of the oxynitride layer 122 using $O_2$ plasma. $HfO_2$ can be used as the oxide layer 124 according to one embodiment of the present invention. At this time, the oxide layer 124 can be formed on the upper part of the oxynitride layer 122 using the PEALD process or the PECVD process. Preferably, the oxide layer 124 can be formed using the PEALD process.

The PEALD process for forming the oxide layer 124 formed of $HfO_2$ is as follows. TEMAH is used as a precursor for forming $HfO_2$, an inside pressure of a chamber is maintained to about 3 torr, and a substrate temperature is maintained at a temperature of about 300° C. First, an inner part of the chamber is purged using Ar gas and then a plasma process is performed while $O_2$ gas is supplied at a fixed rate of about 90 sccm for about 1 second, thereby forming the oxide layer 124. Afterwards, the inner part of the chamber can be selectively purged using Ar gas.

Here, various gases containing oxygen can be used instead of $O_2$ plasma. For example, $O_2$ gas, $O_3$ gas, $H_2O$ gas, or the like, can be used.

Next, the upper electrode 130 is formed on an upper part of the oxide layer 124. The upper electrode 130 can be formed using TiN in consideration of an interference characteristic between the layers and electrical conductivity, or the like, as in the lower electrode 110.

It is preferable that the formation process of the oxynitride layer 122 and the formation process of the oxide layer 124 are performed using an in-situ process for keeping the inner part of the chamber in a vacuum state.

Although the structure in which the oxynitride layer 122 and the oxide layer 124 are sequentially stacked on the lower electrode 110 is described in one embodiment of the present invention shown in FIG. 1, the stacking order of the oxynitride layer 122 and the oxide layer 124 in present invention is not limited. If a voltage is applied to the analog capacitor 100, the capacitance of the analog capacitor 100 changes. The reason for this is that the upper part of the lower electrode 110 is oxidized by $O_2$ gas supplied within the chamber in the formation process of the dielectric layer 120 so that an interface characteristic between the lower electrode 110 and the dielectric layer 120 becomes poor. Thus, in order to restrain the upper part of the lower electrode 110 from being oxidized in the formation process of the dielectric layer 120, it is preferable that the oxynitride layer 122 containing a relatively low concentration of oxygen be formed at an interface between the lower electrode 110 and the dielectric layer 120. When the oxynitride layer 122 is formed using the PEALD process, the oxynitride layer 122 can be deposited while varying the flow rates per cycle of $NH_3$ gas and $O_2$ gas. Thus, when the oxynitride layer 122 is formed at the interface between the lower electrode 110 and the dielectric layer 120, the concentration of nitrogen at an interface between the oxynitride layer 122 and the lower electrode 110 is made to be higher than the concentration of oxygen at the interface by varying the flow rates per cycle of $NH_3$ gas and $O_2$ gas, thereby preferably restraining the upper part of the lower electrode 110 from being oxidized. Further, in order to improve the characteristics at interfaces between the oxynitride layer 122 and layers neighboring the oxynitride layer 122, the flow rates per cycle of $NH_3$ gas and $O_2$ gas are adjusted properly so that a concentration ratio of nitrogen and a concentration ratio of oxygen within the oxynitride layer 122 can be adjusted.

Characteristics of the analog capacitor 100 having a structure of lower electrode-$HfO_xN_y$—$HfO_2$-upper electrode according to one embodiment of the present invention are described with reference to FIGS. 2 through 4.

Figure 2:
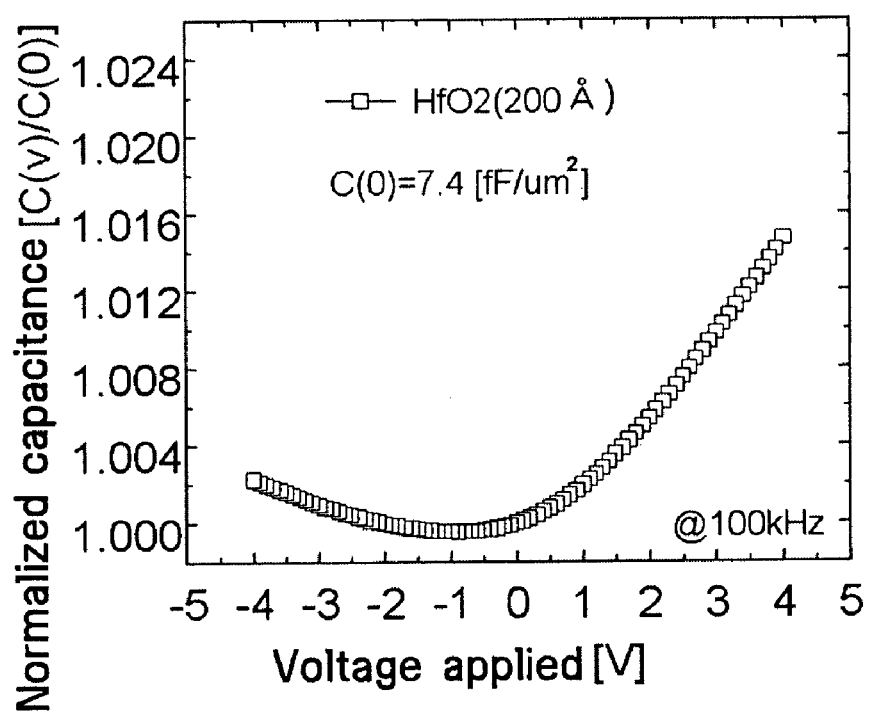
Figure 3:
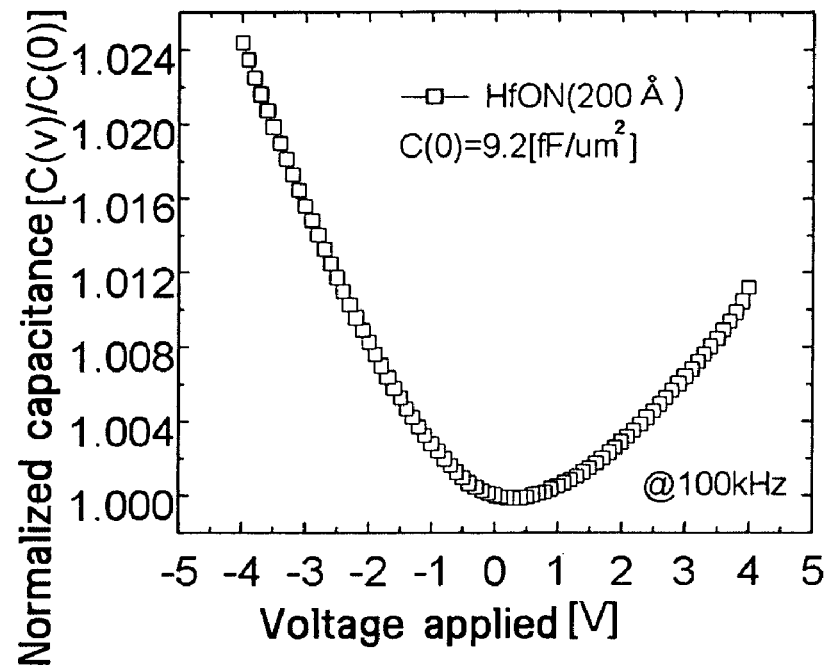
Figure 4:
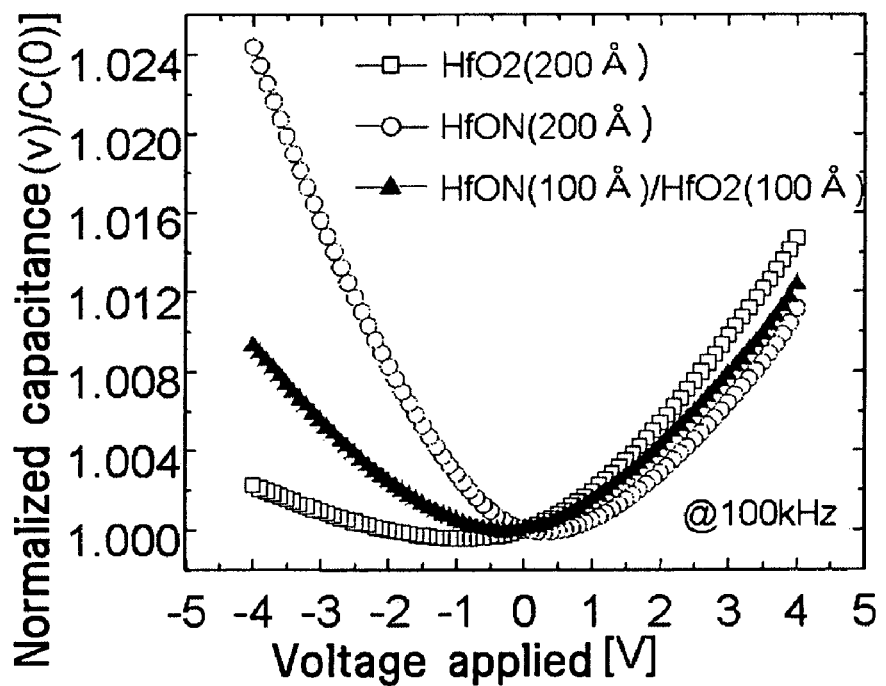

FIGS. 2 through 4 are graphs of measured data showing changes in capacitance of the analog capacitor according to changes in voltage applied to the analog capacitor.

FIG. 2 is a graph of measured data showing changes in capacitance of the analog capacitor when TiN is used as the lower electrode 110 and the upper electrode 130 and $HfO_2$ having a thickness of 200 Å is used as a dielectric layer. FIG. 3 is a graph of measured data showing changes in capacitance of the analog capacitor when TiN is used as the lower electrode 110 and the upper electrode 130 and $HfO_xN_y$ having a thickness of 200 Å is used as a dielectric layer. FIG. 4 is a graph of measured data showing changes in capacitance of the analog capacitor when TiN is used as the lower electrode 110 and the upper electrode 130 and a stack structure comprising $HfO_xN_y$ having a thickness of 100 Å and $HfO_2$ having a thickness of 100 Å is used as the dielectric layer 120. Here, the $HfO_2$ layer is formed by the PEALD process using $O_2$ plasma, and the $HfO_xN_y$ layer is formed by the PEALD process alternately using $NH_3$ plasma and $O_2$ plasma.

As shown in FIGS. 2 through 4, the capacitance of the analog capacitor 100 with respect to the applied voltage can be expressed as a quadratic function. That is, the changes in capacitance ($C(V)$) according to the applied voltage (V) are normalized on the basis of capacitance ($C(0)$) of a case where the applied voltage is 0V, thereby making it possible to obtain a quadratic function of $C(V)/C(0)=(aV^2+bV+1)$.

The measured data of FIGS. 2 through 4 are fitted to the quadratic function of $C(V)/C(0)=(aV^2+bV+1)$ so that the "voltage coefficients of capacitor" (VCC) of the analog capacitor 100, that is, the values a and b in the above function, can be obtained.

The measured data of FIG. 2 in which the $HfO_2$ single layer is used as the dielectric layer are fitted to the quadratic function so that a quadratic function of $C(V)/C(0)=0.00054V^2+0.00146V+1$ can be obtained. Here, $C(0)$ is 7.4 fF/μm$^2$ and VCC b has a positive value of 0.00146.

The measured data of FIG. 3 in which the $HfO_xN_y$ single layer is used as the dielectric layer are fitted to the quadratic function so that a quadratic function of $C(V)/C(0)=0.00111V^2-0.00153V+1$ can be obtained. Here, $C(0)$ is 9.2 fF/μm$^2$ and VCC b has a negative value of −0.00153.

The measured data of FIG. 4 in which a multi-layered layer, in which the $HfO_xN_y$ layer and the $HfO_2$ layer are stacked, is used as the dielectric layer 120 are fitted to the quadratic function so that a quadratic function of $C(V)/C(0)=0.00068V^2+0.00039V+1$ can be obtained. Here, $C(0)$ is 7.6 fF/μm$^2$ and VCC b is 0.00039.

In a case where the applied voltage is small, since the square of the applied voltage in the quadratic function has little affect on the capacitance, the influence of the applied voltage on the capacitance is determined by VCC b. It can be known that VCC b has a positive value when an oxide layer such as $HfO_2$ is used as the dielectric layer as in FIG. 2 and the VCC b has a negative value when an oxynitride layer such as $HfO_xN_y$ is used as the dielectric layer as in FIG. 3. Thus, as shown in FIG. 4, the VCC b has a value close to 0 when the dielectric layer 120, in which an oxide layer such as $HfO_2$ and an oxynitride layer such as $HfO_xN_y$ are stacked, is used, thereby reducing the whole influence of the applied voltage on the capacitance.

The present invention is not limited in the stacking order of the oxynitride layer 122 and the oxide layer 124 on the lower electrode 110. The ratios occupied by the oxynitride layer 122 and the oxide layer 124 with respect to the total thickness of the dielectric layer 120 are adjusted so that the VCC b is close to 0. As a result, the influence of the applied voltage on the capacitance can be reduced.

Hereinafter, an analog capacitor according to another embodiment of the present invention are described with reference to FIGS. 5 and 6.

Figure 5:
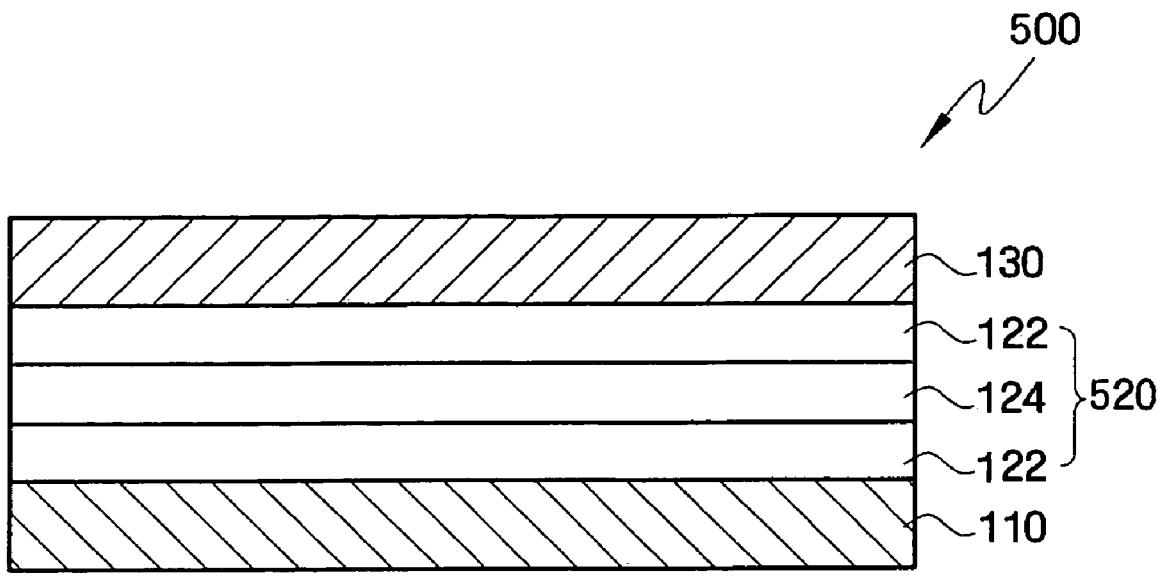
FIG. 5 is a schematic cross-sectional view showing a structure of an analog capacitor according to another embodiment of the present invention.

FIG. 5 is a cross-sectional view showing a structure of an analog capacitor according to another embodiment of the present invention. As shown in FIG. 5, an analog capacitor 500 has a structure in which a lower electrode 110, a dielectric layer 520 of a three-layer structure composed of at least one oxynitride layer and at least one oxide layer, and an upper electrode 130 are stacked sequentially. The present embodiment is described using the dielectric layer 520 in which an oxide layer 122, an oxynitride layer 124 and an oxide layer 122 are stacked sequentially. As described above, the number of oxynitride layers and oxide layers making up the dielectric layer 520 in the present invention is not limited. The oxynitride layer and the oxide layer making up the dielectric layer 520 of FIG. 5 can be formed using the same material and the same process as the oxynitride layer and the oxide layer shown in FIG. 1, respectively.

It is preferable that the oxide layer 122 and the oxynitride layer 124 be formed using an in-situ process for keeping an inner part of a chamber in a vacuum state.

Hereinafter, the analog capacitor having a structure of lower electrode-$HfO_2$—$HfO_xN_y$—$HfO_2$-upper electrode will be described in detail for convenience of description of the present invention.

Figure 6:
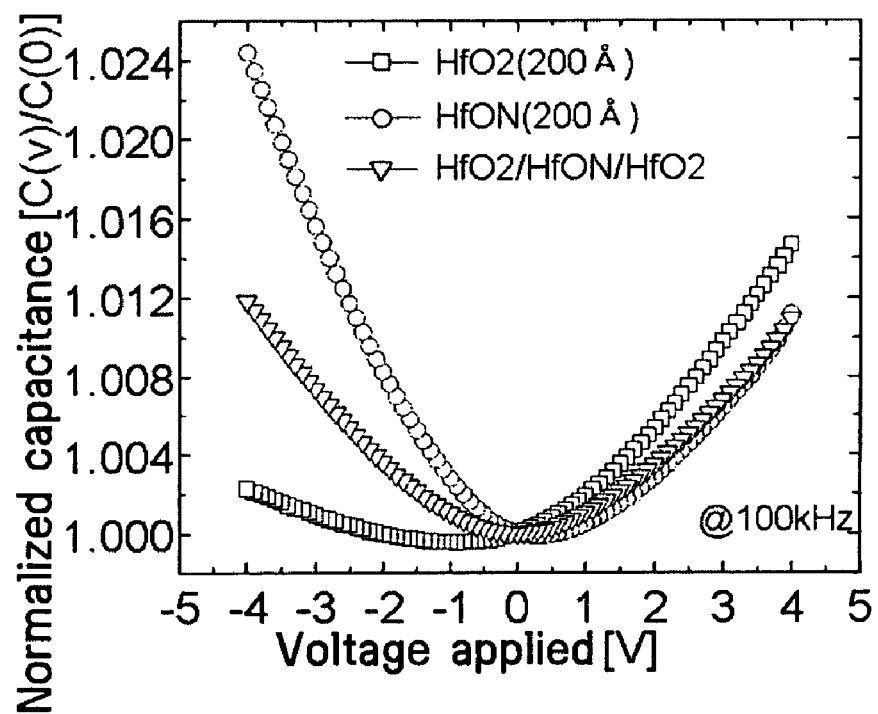
FIG. 6 is a graph of measured data showing changes in capacitance of an analog capacitor having a structure of lower electrode-$HfO_2$—$HfO_xN_y$—$HfO_2$-upper electrode according to changes in voltage applied to the analog capacitor.

FIG. 6 is a graph of measured data showing changes in capacitance of an analog capacitor having a structure of lower electrode-$HfO_2$—$HfO_xN_y$—$HfO_2$-upper electrode according to changes in voltage applied to the analog capacitor. That is, FIG. 6 is a graph of measured data showing changes in capacitance of the analog capacitor 500 when TiN is used as the lower electrode 110 and the upper electrode 130 and a stack structure comprised of $HfO_2$ having a thickness of 50 Å, $HfO_xN_y$ having a thickness of 100 Å and $HfO_2$ having a thickness of 50 Å is used the dielectric layer 520. Here, the $HfO_2$ layer is formed by the PEALD process using $O_2$ plasma and the $HfO_xN_y$ layer is formed by the PEALD process using $NH_3$ plasma and $O_2$ plasma.

The measuring data of FIG. 6 are fitted to a quadratic function of $C(V)/C(0)=(aV^2+bV+1)$ so that VCC of the analog capacitor 500, that is, a and b, are obtained. As a result, a quadratic function of $C(V)/C(0)=0.00072V^2-0.00009V+1$ is obtained. Here, $C(0)$ is 7.9 $fF/\mu m^2$ and VCC b has a negative value of $-0.00009$.

It can be known that VCC b of the analog capacitor having the dielectric layer composed of one oxynitride layer and at least one oxide layer of FIG. 6 has a value closer to 0 than that of the analog capacitor of FIG. 4. That is, as the number of the oxide layers and the oxynitride layers making up the dielectric layer increases, VCC b becomes closer to 0. Accordingly, the whole influence of the applied voltage on the capacitance is reduced.

Although the analog capacitor composed of the combination of the oxynitride layer and the oxide layer with respect to the same kind of element was described in FIGS. 4 and 6, the present invention is not limited thereto and can be applied to an analog capacitor composed of the combination of an oxynitride layer and an oxide layer with respect to different kinds of elements. For example, an analog capacitor having a capacitance that is not affected by applied voltage can be formed using a combination of an oxynitride layer and an oxide layer with respect to each of Ta and Hf. A multi-layered dielectric layer included in the above analog capacitor can have structures of $TaO_xN_y$—$HfO_2$—$Ta_2O_5$, $Ta_2O_5$—$HfO_xN_y$—$Ta_2O_5$, $Ta_2O_5$—$HfO_2$—$TaO_xN_y$, $Ta_2O_5$—$HfO_xN_y$—$TaO_xN_y$, $TaO_xN_y$—$HfO_2$—$TaO_xN_y$, $TaO_xN_y$—$HfO_xN_y$, $HfO_xN_y$—$Ta_2O_5$—$HfO_2$, $HfO_2$—$TaO_xN_y$—$HfO_2$, $HfO_2$—$Ta_2O_5$—$HfO_xN_y$, $HfO_2$—$TaO_xN_y$—$HfO_xN_y$, $HfO_xN_y$—$Ta_2O_5$—$HfO_xN_y$ or $HfO_xN_y$—$TaO_xN_y$—$HfO_2$.

The multi-layered dielectric layer composed of the combination of the oxynitride layer and the oxide layer with respect to different kinds of elements can be formed using a PEALD process or a PECVD process, preferably, using the PEALD process.

A lower electrode and an upper electrode can be formed of a material selected from the group consisting of polysilicon, TiN, TaN, Ti, Ta, W, WN, Al, Cu, Ru, Pt, Ir, $RuO_2$, $IrO_2$ and a combination thereof. Moreover, in a case where the analog capacitor has a MIN structure, it is preferable that TiN be used as the lower electrode and the upper electrode in consideration of an interference characteristic between the layers and electrical conductivity. Further, the lower electrode and the upper electrode can be formed in various shapes such as a cylinder shape or a stack shape.

The stacking order of the oxynitride layer ($TaO_xN_y$ or $HfO_xN_y$) and the oxide layer ($Ta_2O_5$ or $HfO_2$) in the multi-layered dielectric layer is not limited. However, as described above, in order to restrain an upper part of the lower electrode from being oxidized in a formation process of the multi-layered dielectric layer, it is preferable that the oxynitride layer ($TaO_xN_y$ or $HfO_xN_y$) containing a relatively low concentration of oxygen be formed at an interface between the lower electrode and the multi-layered dielectric layer. When the oxynitride layer is formed using the PEALD process, the oxynitride layer can be deposited while varying the flow rates per cycle of $NH_3$ gas and $O_2$ gas. Thus, when the oxynitride layer is formed at the interface between the lower electrode and the multi-layered dielectric layer, a concentration of nitrogen at an interface between the oxynitride layer and the lower electrode is made to be higher than a concentration of oxygen at the interface by varying the flow rates per cycle of $NH_3$ gas and $O_2$ gas, thereby preferably restraining the upper part of the lower electrode from being oxidized. Further, in order to improve the characteristics at interfaces between the oxynitride layer and layers neighboring the oxynitride layer, the flow rates per cycle of $NH_3$ gas and $O_2$ gas are adjusted properly so that a concentration ratio of nitrogen and a concentration ratio of oxygen within the oxynitride layer can be adjusted.

Hereinafter, characteristics of the analog capacitor according to still another embodiment of the present invention are described with reference to FIGS. 7 and 8.

Figure 7:
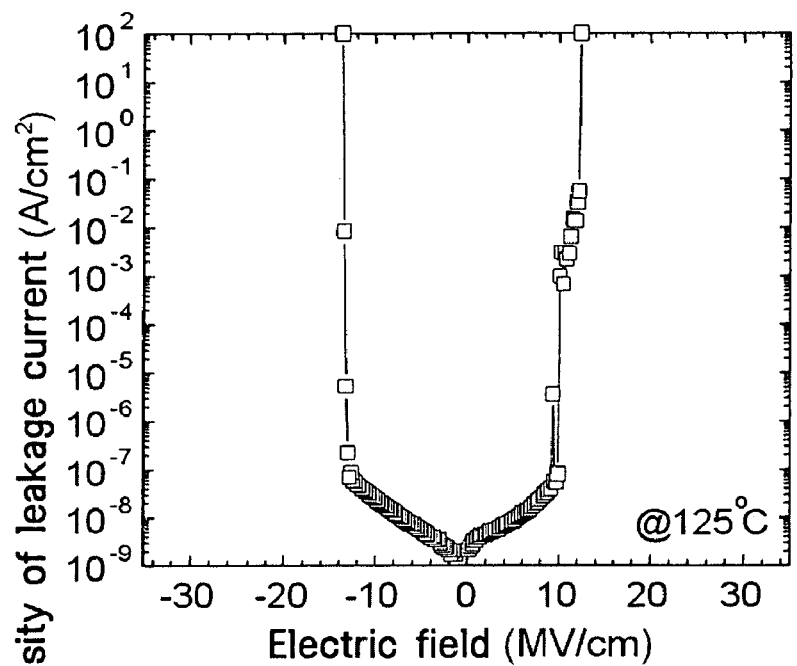
FIG. 7 is a graph of measured data showing changes in density of a leakage current and a breakdown voltage of an analog capacitor having a structure of lower electrode-$HfO_2$-upper electrode according to changes in an electric field of the analog capacitor.
Figure 8:
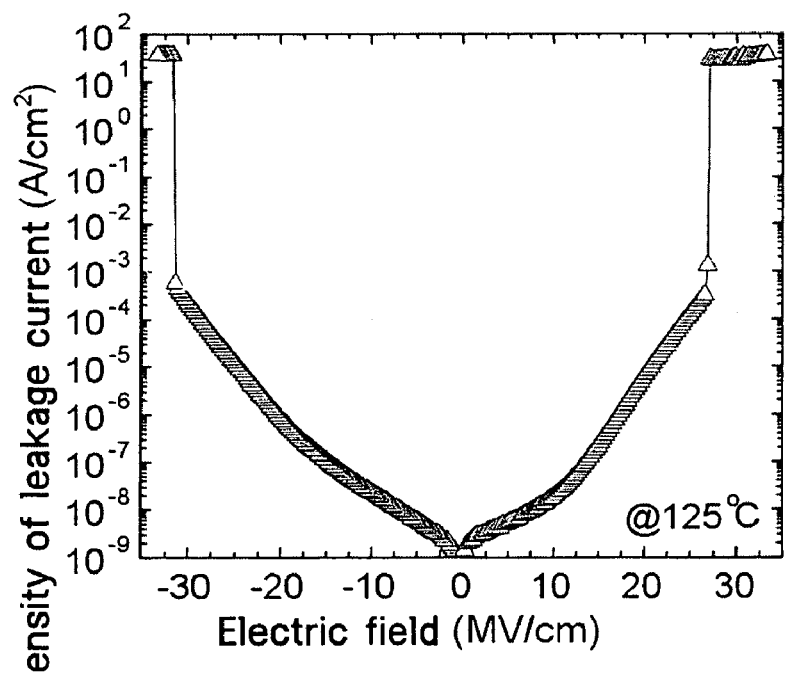
FIG. 8 is a graph of measured data showing changes in density of a leakage current and a breakdown voltage of the analog capacitor having a structure of lower electrode-$HfO_2$—$HfO_xN_y$—$HfO_2$-upper electrode according to changes in an electric field of the analog capacitor.

FIGS. 7 and 8 are graphs of measured data showing changes in density of a leakage current and a breakdown voltage of an analog capacitor according to changes in an electric field of the analog capacitor.

FIG. 7 is a graph of measured data showing changes in density of a leakage current of an analog capacitor when TiN is used as a lower electrode and an upper electrode and $HfO_2$ having a thickness of 260 Å is used as a dielectric layer. FIG. 8 is a graph of measuring data showing changes in density of a leakage current of an analog capacitor when TiN is used as a lower electrode and an upper electrode and a stack structure comprised of $HfO_2$ having a thickness of 70 Å, $HfO_xN_y$ having a thickness of 60 Å and $HfO_2$ having a thickness of 70 Å is used as a dielectric layer.

Here, the $HfO_2$ layer was formed by the PEALD process using $O_2$ plasma and the $HfO_xN_y$ layer was formed by the PEALD process alternately using $NH_3$ plasma and $O_2$ gas. That is, the $HfO_xN_y$ layer was formed using $O_2$ gas instead of $O_2$ plasma.

In the dielectric layer composed of the $HfO_2$ single layer shown in FIG. 7, while the leakage current is suppressed so as not to exceed about $10^{-7}$ $A/cm^2$, the breakdown voltage is about 10 MV/cm. In the dielectric layer composed of the $HfO_2$—$HfO_xN_y$—$HfO_2$ triple layer shown in FIG. 8, the leakage current is suppressed so as not to exceed about $10^{-7}$ $A/cm^2$ under an electric field of 20 MV/cm and the breakdown voltage is about 30 MV/cm.

Accordingly, referring to FIGS. 7 and 8, the density of the leakage current can be suppressed and simultaneously the breakdown voltage can be increased by using the dielectric layer in which at least one oxide layer and at least one oxynitride layer are stacked. In particular, in a case where the oxide layer is located on an upper part and/or a lower part of the dielectric layer, better effects can be obtained.

In a case where the $HfO_2$ single layer is used as the dielectric layer as in FIG. 7, since an energy band gap is large due to a property of a material of $HfO_2$, the leakage current is small.

However, if crystallization occurs during the deposition of the $HfO_2$ single layer, the dielectric layer having undergone crystallization is broken along a grain boundary that is weak to stress when an electric field is applied thereto, so that the low breakdown voltage is obtained.

In a case where the $HfO_2$—$HfO_xN_y$—$HfO_2$ triple layer is used as the dielectric layer as in FIG. 8, the $HfO_2$ layers which are located on the upper part and the lower part of the dielectric layer and have a large energy band gap suppress the leakage current. Further, the texture of the $HfO_xN_y$ layer is made to be not dense and loose by forming the $HfO_xN_y$ layer interposed between both the $HfO_2$ layers by the PEALD process using $O_2$ gas, which has a weak reaction, instead of $O_2$ plasma. Accordingly, carbon (C) contained in TEMAH used as a precursor is captured in $HfO_xN_y$ so that the crystallization of $HfO_xN_y$ is interrupted and the $HfO_xN_y$ layer has an amorphous characteristic unlike the $HfO_2$ layer. Since a grain boundary is not formed in the $HfO_xN_y$ layer having the amorphous characteristic, the dielectric layer composed of the oxide layer-oxynitride layer-oxide layer has a high breakdown density. Although the $HfO_xN_y$ layer having the amorphous characteristic is formed using $O_2$ gas having the weak reaction therein, the present invention is not limited thereto. That is, the $HfO_xN_y$ layer having the amorphous characteristic can be formed by properly adjusting process conditions while using $O_2$ plasma, $O_3$ gas, $H_2O$ gas, or the like.

Since the dielectric layer of FIG. 8 is composed of at least one oxide layer and at least one oxynitride layer, the influence of the applied voltage on the capacitance can be reduced as described above. That is, more improved effects can be obtained by using a multi-layered dielectric layer composed of at least one oxide layer and at least one oxynitride layer compared with the $HfO_2$ single layer as a dielectric layer for reducing the influence of the applied voltage on the capacitance.

As described above, in the analog capacitor and the manufacturing method according to the present invention, the influence of an applied voltage on capacitance can be reduced and a low leakage current and a high breakdown voltage can be obtained.

Although the present invention has been described in connection with the exemplary embodiments of the present invention, it will be apparent to those skilled in the art that various modifications and changes may be made thereto without departing from the scope and spirit of the invention.

Therefore, it should be understood that the above embodiments are not limitative, but illustrative in all aspects.

What is claimed is:

1. An analog capacitor comprising:
   a TiN lower electrode which is formed on a substrate;
   a multi-layered dielectric layer which is formed on the TiN lower electrode and has a stack structure selected from the group consisting of $TaO_xN_y$—$HfO_2$—$Ta_2O_5$, $Ta_2O_5$—$HfO_xN_y$—$Ta_2O_5$, $Ta_2O_5$—$HfO_2$—$TaO_xN_y$, $Ta_2O_5$—$HfO_xN_y$—$TaO_xN_y$, $TaO_xN_y$—$HfO_2$—$TaO_xN_y$, $TaO_xN_y$—$HfO_xN_y$—$Ta_2O_5$, $HfO_xN_y$—$Ta_2O_5$—$HfO_2$, $HfO_2$—$TaO_xN_y$—$HfO_2$, $HfO_2$—$Ta_2O_5$—$HfO_xN_y$, $HfO_2$—$TaO_xN_y$—$HfO_xN_y$, $HfO_xN_y$—$Ta_2O_5$—$HfO_xN_y$ and $HfO_xN_y$—$TaO_xN_y$—$HfO_2$, wherein x and y are greater than zero; and
   a TiN upper electrode which is formed on the multi-layered dielectric layer.

2. The analog capacitor of claim 1, wherein the $TaO_xN_y$ or $HfO_xN_y$ layer is formed at an interface between the multi-layered dielectric layer and the TiN lower electrode.

3. The analog capacitor of claim 2, wherein the nitrogen concentration in the $TaO_xN_y$ or $HfO_xN_y$ layer is higher than the oxygen concentration in the $TaO_xN_y$ or $HfO_xN_y$ layer near the TiN lower electrode.

4. An analog capacitor comprising:
   a TiN lower electrode which is formed on a substrate;
   a multi-layered dielectric layer which is formed on the TiN lower electrode and has a stack structure selected from the group consisting of $TaO_xN_y$—$HfO_2$—$Ta_2O_5$, $Ta_2O_5$—$HfO_xN_y$—$Ta_2O_5$, $Ta_2O_5$—$HfO_2$—$TaO_xN_y$, $Ta_2O_5$—$HfO_xN_y$—$TaO_xN_y$, $TaO_xN_y$—$HfO_2$—$TaO_xN_y$, $TaO_xN_y$—$HfO_xN_y$—$Ta_2O_5$, $HfO_xN_y$—$Ta_2O_5$—$HfO_2$, $HfO_2$—$TaO_xN_y$—$HfO_2$, $HfO_2$—$Ta_2O_5$—$HfO_xN_y$, $HfO_2$—$TaO_xN_y$—$HfO_xN_y$, $HfO_xN_y$—$Ta_2O_5$—$HfO_xN_y$ and $HfO_xN_y$—$TaO_xN_y$—$HfO_2$; and
   a TiN upper electrode which is formed on the multi-layered dielectric layer,
   wherein the $TaO_xN_y$ or $HfO_xN_y$ layer is formed at an interface between the multi-layered dielectric layer and the TiN lower electrode, and
   wherein the nitrogen concentration in the $TaO_xN_y$ or $HfO_xN_y$ layer is higher than the oxygen concentration in the $TaO_xN_y$ or $HfO_xN_y$ layer near the TiN lower electrode.

* * * * *